(12) United States Patent
Wai et al.

(10) Patent No.: US 8,535,988 B2
(45) Date of Patent: *Sep. 17, 2013

(54) LARGE PANEL LEADFRAME

(75) Inventors: Yong Lam Wai, Ipoh (MY); Chan Boon Meng, Ipoh (MY); Phang Hon Keat, Jelapang (MY)

(73) Assignee: Carsem (M) Sdn. Bhd., Ipoh (MY)

( * ) Notice: Subject to any disclaimer, the term of this patent is extended or adjusted under 35 U.S.C. 154(b) by 0 days.

This patent is subject to a terminal disclaimer.

(21) Appl. No.: 13/481,652

(22) Filed: May 25, 2012

(65) Prior Publication Data

US 2013/0109137 A1    May 2, 2013

(30) Foreign Application Priority Data

Nov. 1, 2011 (MY) ............................ PI 2011005275

(51) Int. Cl.
*H01L 21/00* (2006.01)

(52) U.S. Cl.
USPC ............ 438/123; 438/110; 438/122; 257/676

(58) Field of Classification Search
USPC .......................... 438/110, 122, 123; 257/676
See application file for complete search history.

(56) References Cited

U.S. PATENT DOCUMENTS

| 5,639,694 | A | * | 6/1997 | Diffenderfer et al. | .......... | 29/827 |
| 6,069,388 | A | * | 5/2000 | Okusa et al. | .................. | 257/347 |
| 6,316,339 | B1 | * | 11/2001 | Okusa et al. | .................. | 438/489 |
| 6,407,411 | B1 | * | 6/2002 | Wojnarowski et al. | ........ | 257/99 |
| 6,521,916 | B2 | * | 2/2003 | Roberts et al. | ............... | 257/100 |
| 6,646,491 | B2 | * | 11/2003 | Worley et al. | ................. | 327/514 |
| 6,849,867 | B2 | * | 2/2005 | Roberts et al. | .................. | 257/25 |
| 7,105,862 | B2 | | 9/2006 | Waitl et al. | | |
| RE39,854 | E | | 9/2007 | Mostafazadeh et al. | | |
| 7,524,087 | B1 | | 4/2009 | Aizar et al. | | |
| 7,566,159 | B2 | | 7/2009 | Oon et al. | | |
| 7,598,528 | B2 | | 10/2009 | Oh et al. | | |
| 7,655,957 | B2 | | 2/2010 | Loh et al. | | |

(Continued)

FOREIGN PATENT DOCUMENTS

| WO | 2008/130140 A1 | 10/2008 |
| WO | 2009/072786 A2 | 6/2009 |
| WO | 2009/082177 A2 | 7/2009 |

OTHER PUBLICATIONS

Non-Final Office Action of Dec. 15, 2011 for U.S. Appl. No. 13/116,986, 11 pages.

(Continued)

*Primary Examiner* — Jarrett Stark
*Assistant Examiner* — Nicholas Tobergte
(74) *Attorney, Agent, or Firm* — Kilpatrick Townsend & Stockton LLP

(57) ABSTRACT

A method of manufacturing an integrated circuit package includes mounting a large panel leadframe having a substantially square shape to a ring. The large panel leadframe includes a plurality of die pads and a corresponding plurality of leads arranged in a matrix pattern. An integrated circuit chip is attached to each of the die pads. An encapsulant material is applied over the integrated circuit chips and at least a part of the large panel leadframe. Each of the die pads and its corresponding leads are separated from the large panel leadframe to form individual integrated circuit packages. The steps of attaching the integrated circuit chips and applying the encapsulant material are performed while the large panel leadframe is mounted to a taped ring.

20 Claims, 7 Drawing Sheets

(56) References Cited

U.S. PATENT DOCUMENTS

| | | |
|---|---|---|
| 7,659,551 B2 | 2/2010 | Loh et al. |
| 8,394,675 B2 | 3/2013 | Wai et al. |
| 2001/0030355 A1* | 10/2001 | Mclellan et al. ............... 257/666 |
| 2002/0180345 A1* | 12/2002 | Hen .............................. 313/499 |
| 2003/0080341 A1 | 5/2003 | Sakano et al. |
| 2004/0188696 A1 | 9/2004 | Chen et al. |
| 2004/0217450 A1 | 11/2004 | Li et al. |
| 2006/0102917 A1 | 5/2006 | Oyama et al. |
| 2006/0157726 A1 | 7/2006 | Loh et al. |
| 2007/0164408 A1 | 7/2007 | Yeh |
| 2008/0121921 A1 | 5/2008 | Loh et al. |
| 2008/0173883 A1 | 7/2008 | Hussell et al. |
| 2008/0254557 A1 | 10/2008 | Kim et al. |
| 2009/0050925 A1 | 2/2009 | Kuramoto et al. |
| 2009/0114936 A1 | 5/2009 | Kashiwao et al. |
| 2009/0267085 A1 | 10/2009 | Lee et al. |
| 2010/0001306 A1 | 1/2010 | Park et al. |
| 2011/0186902 A1 | 8/2011 | Egoshi et al. |
| 2011/0217814 A1 | 9/2011 | Gao et al. |
| 2012/0104421 A1 | 5/2012 | Wai et al. |
| 2012/0107974 A1 | 5/2012 | Wai et al. |

OTHER PUBLICATIONS

Non-Final Office Action of Jul. 17, 2012 for U.S. Appl. No. 13/116,986, 7 pages.

Notice of Allowance of Dec. 18, 2012 for U.S. Appl. No. 13/116,986, 9 pages.

Malaysian Patent Application No. PI2010005176, filing date Nov. 2, 2010, 33 pages.

* cited by examiner

LPF/S Mounted on Ring

LARGE PANEL LEADFRAME

CROSS-REFERENCE TO RELATED APPLICATIONS

This application claims priority to Malaysian Patent Application No. PI 2011005275, filed Nov. 1, 2011, the disclosure of which is incorporated herein by reference in its entirety for all purposes.

BACKGROUND

The present invention relates generally to integrated circuit (IC) packaging technology. More particularly, embodiments of the present invention pertain to IC packaging processes using large panel leadframes.

Leadframes are commonly used to package ICs. One example of a known leadframe IC packaging technique is shown in FIG. 1. FIG. 1 is a simplified cross-sectional view of a conventional molded leadframe package (MLP) 10. MLP 10 includes an IC die 12 attached to a die pad 14 (also referred to as a die paddle) of a leadframe by an adhesive 13. Bonding pads 18 on top of IC die 12 are connected to leads 16 of the leadframe by wirebonds 19. An encapsulant material 20 covers the package including IC die 12, wirebonds 19, and upper surfaces of die pad 14 and leads 16. Die pad 14 and leads 16 are exposed on the bottom to facilitate heat dissipation from IC die 12 and to decrease overall thickness of MLP 10. Half-etched portions 17 of the leadframe are formed on sidewall surfaces of die pad 14 and leads 16. Encapsulant material 20 extends underneath half-etched portions 17 to mechanically secure die pad 14 and leads 16 to MLP 10.

MLP 10 is typically one of many IC packages that are formed in a matrix pattern using a leadframe strip. FIG. 2 is a simplified plan view of a conventional leadframe strip 30 that can be used to form a plurality of leadframe packages. Leadframe strip 30 includes an outer frame 32 to which a number of horizontal and vertical connecting bars 36, 38 are attached. Horizontal and vertical connecting bars 36, 38 define a plurality of inner frames 40 arranged in a matrix that each include an IC receiving area (or die pad). In this example, leadframe strip 30 includes a matrix of 9×9 inner frames 40. Outer frame 32 includes a plurality of positioning holes 34 that can be used to position leadframe strip 30 on appropriate tools during die attach, wirebonding, encapsulation, and singulation processes.

FIG. 3 is an enlarged view of a portion of a leadframe strip. FIG. 3 shows the portion of leadframe strip 30 inside dashed box A of FIG. 2. FIG. 3 shows a die pad 14 and leads 16 within each inner frame 40.

There are manufacturing limitations associated with current MLP packaging techniques. For example, current MLP packaging techniques generally suffer from low productivity due to low density leadframes and/or substrates, low production rates (number of units produced per hour), high capital investments, long lead times for new tooling and qualification, and other limitations.

In light of the above and in view of a general trend of shorter produce life cycles for ICs, improved MLP packages and manufacturing methods are desired.

SUMMARY

Embodiments of the present invention provide methods of manufacturing MLP (or more generally integrated circuit) packages. For example, one embodiment of the present invention includes mounting a large panel leadframe (or a large panel frame/substrate—LPF/S) having a substantially square shape to a ring. The large panel leadframe includes a plurality of die pads and a corresponding plurality of leads arranged in a matrix pattern. An integrated circuit chip is attached to each of the die pads. An encapsulant material is applied over the integrated circuit chips and at least a part of the large panel leadframe. Each of the die pads and its corresponding leads are separated from the large panel leadframe to form individual integrated circuit packages. The steps of attaching the integrated circuit chips and applying the encapsulant material are performed while the large panel leadframe is mounted to a ring.

In an embodiment, applying the encapsulant material further includes providing an array mold cavity, dispensing the encapsulant material into the array mold cavity, engaging the array mold cavity including the encapsulant material with the large panel leadframe including the integrated circuit chips, and curing the encapsulant material.

In another embodiment, the large panel leadframe is mounted to the ring using an adhesive tape.

In another embodiment, the large panel leadframe and ring are transported using a handler that provides movement in forward/backward and lateral directions during the steps of attaching the integrated circuit chips, applying the encapsulant material, and separating the plurality of die pads and the corresponding leads from the large panel leadframe.

In another embodiment, each of the plurality of die pads are planar.

In another embodiment, each of the plurality of die pads include a planar surface extending along a bottom of a recessed cavity.

In another embodiment, the large panel leadframe has a size of about 200 mm by about 200 mm.

In another embodiment, the integrated circuit chips are attached to each of the plurality of die pads using an epoxy.

In another embodiment, the method also includes wirebonding the plurality of leads of the large panel leadframe to respective bonding pads disposed on a surface of the integrated circuit chips.

In another embodiment, the ring is substantially planar and the large panel leadframe is mounted to a surface of the ring.

In another embodiment, the integrated circuit chips include at least one of a light emitting diode (LED), a memory device, a logic device, or a processor.

In yet another embodiment, the integrated circuit packages include at least one of a quad-flat no-leads (QFN) package, a ball grid array (BGA) package, a small scale ball grid array (SSBGA) package, a land grid array (LGA) package, a system-in-package (SiP) package, or a mini-pak package.

Another embodiment of the present invention provides a method of manufacturing integrated circuit packages that includes mounting a large panel leadframe to a ring. The large panel leadframe may include a plurality of die pads and a corresponding plurality of leads surrounding the die pads. The plurality of die pads and the plurality of leads may be arranged in a matrix pattern. The method also includes attaching an integrated circuit chip to each of the plurality of die pads and wirebonding each of the plurality of leads to respective bonding pads disposed on a surface of the integrated circuit chips. The method also includes applying an encapsulant material overlaying the integrated circuit chips and at least a part of the large panel leadframe and separating the plurality of die pads and the corresponding leads from the large panel leadframe to form the integrated circuit packages. The steps of attaching the integrated circuit chips, wirebonding each of the plurality of leads, applying the encapsulant material, and separating the plurality of die pads may be performed while the large panel leadframe is mounted to the ring.

Yet another embodiment of the present invention provides a method of manufacturing integrated circuit packages that includes mounting a large panel leadframe to a ring. The large panel leadframe may include a plurality of die attach regions and a corresponding plurality of leads surrounding the die attach regions. The plurality of die attach regions and the plurality of leads may be arranged in a matrix pattern. The method also includes placing one or more integrated circuit chips in each of the plurality of die attach regions and wirebonding each of the plurality of leads to respective bonding pads disposed on a surface of the integrated circuit chips. The method also includes applying an encapsulant material overlaying the integrated circuit chips and at least a part of the large panel leadframe and separating the plurality of die attach regions and the corresponding leads from the large panel leadframe to form the integrated circuit packages. The steps of placing one or more circuit chips in each of the die attach regions, wirebonding each of the plurality of leads to respective bonding pads, applying the encapsulant material, and separating the plurality of die attach regions may be performed while the large panel leadframe is mounted to the ring.

In an embodiment, the die attach regions include die pads.

In another embodiment, the die attach regions do not include die pads.

Many benefits are achieved by way of the present invention over conventional techniques. For example, some embodiments involve mounting a large panel leadframe to a ring. In an embodiment, the large panel leadframe is larger than conventional leadframes, and may have a size of up to 200 mm×200 mm or more. This can increase unity density by as much as 450% or more. The ring supports the large panel leadframe and provides a means by which the large panel leadframe can be handled in an automated fashion by packaging equipment. The packaging equipment may include equipment configured to attach one or more IC die to each die pad of the large panel leadframe, equipment configured to apply encapsulant material over the IC die and a portion of the large panel leadframe, and equipment configured to separate the packaged IC die from the large panel leadframe. Thus, embodiments of the present invention can provide MLP packages with various efficiencies while reducing manufacturing complexity and shortening manufacturing leadtimes. Depending upon the embodiment, one or more of these benefits may exist. These and other benefits are described throughout the specification and more particularly below.

DETAILED DESCRIPTION

Embodiments of the present invention provide improved methods of manufacturing MLP (or integrated circuit) packages. These methods may be used to increase throughput and reduce costs. It should be appreciated that the methods described herein may be used with any type of IC die including light emitting diodes (LEDs), memory or logic devices, processors, and the like. Further, the methods may be used to manufacture any type of MLP package including quad-flat no-leads (QFN) packages, ball grid array (BGA) packages, small scale ball grid array (SSBGA) packages, land grid array (LGA) packages, system-in-package (SiP) packages, minipak packages, and the like. The methods may also be used to manufacture MLP packages that do not include die pads.

Figure 1:
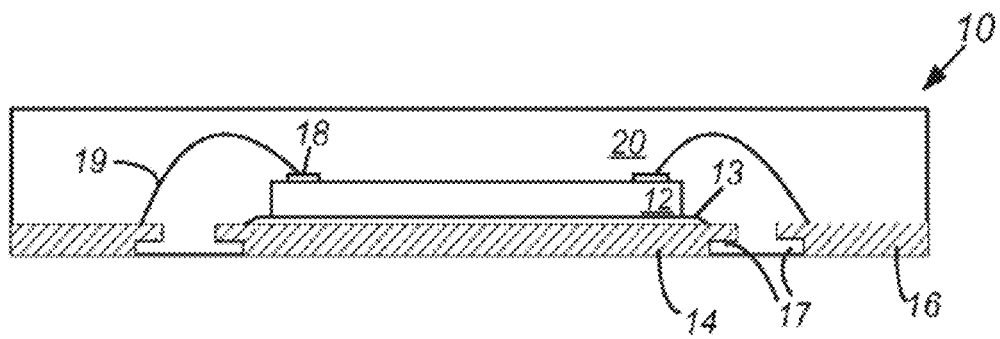
FIG. 1 is a simplified cross-sectional view of a conventional molded leadframe package.
Figure 2:
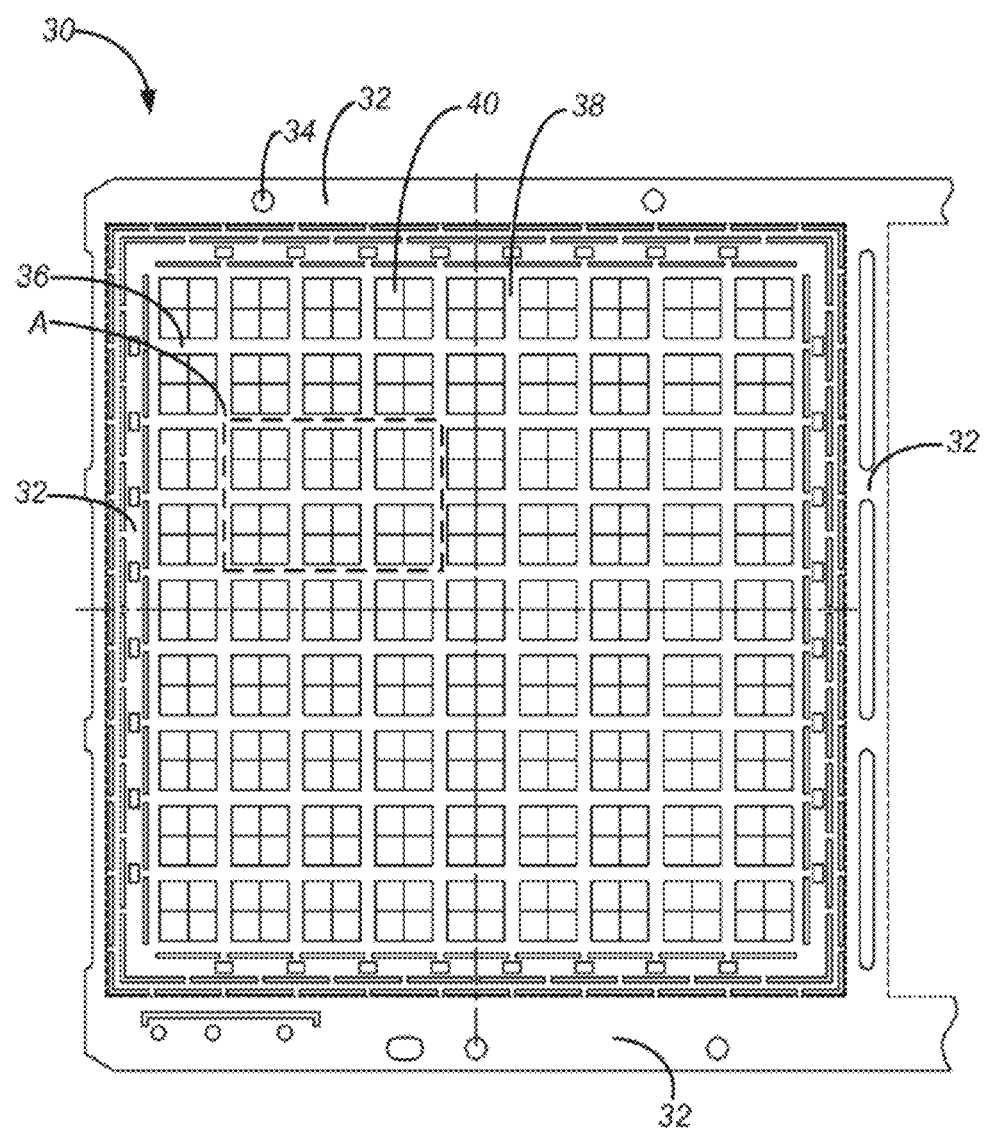
FIG. 2 is a simplified plan view of a conventional leadframe strip that can be used to form a plurality of leadframe packages.
Figure 3:
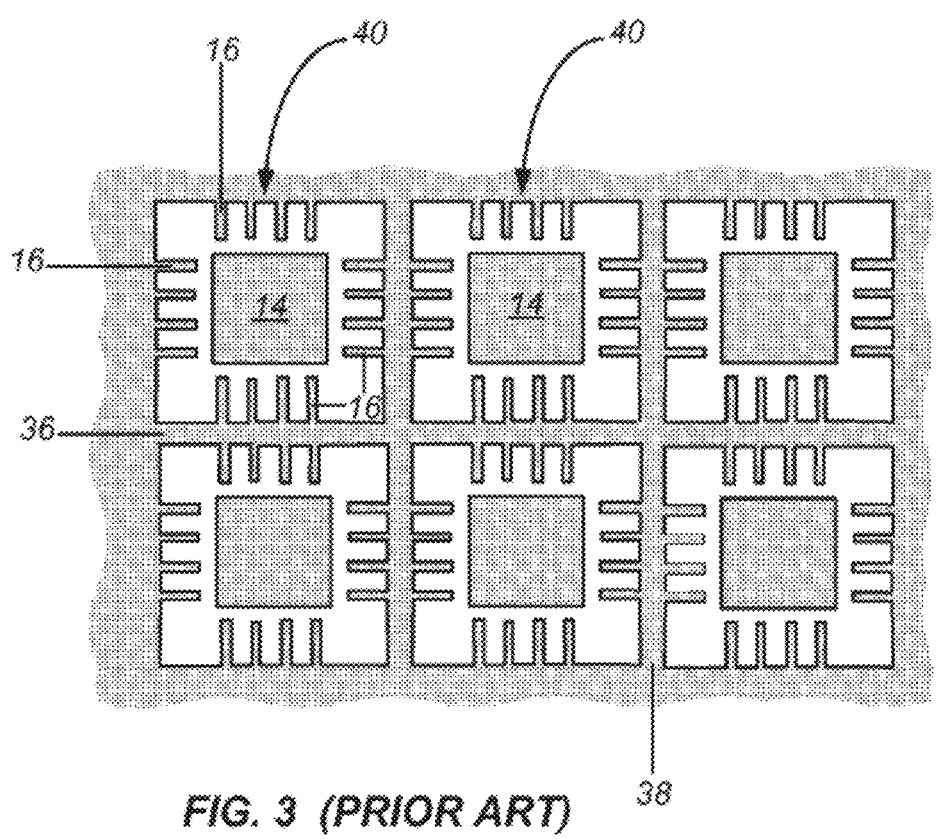
FIG. 3 is an enlarged view of a portion of a leadframe strip.
Figures 4A, 4B:
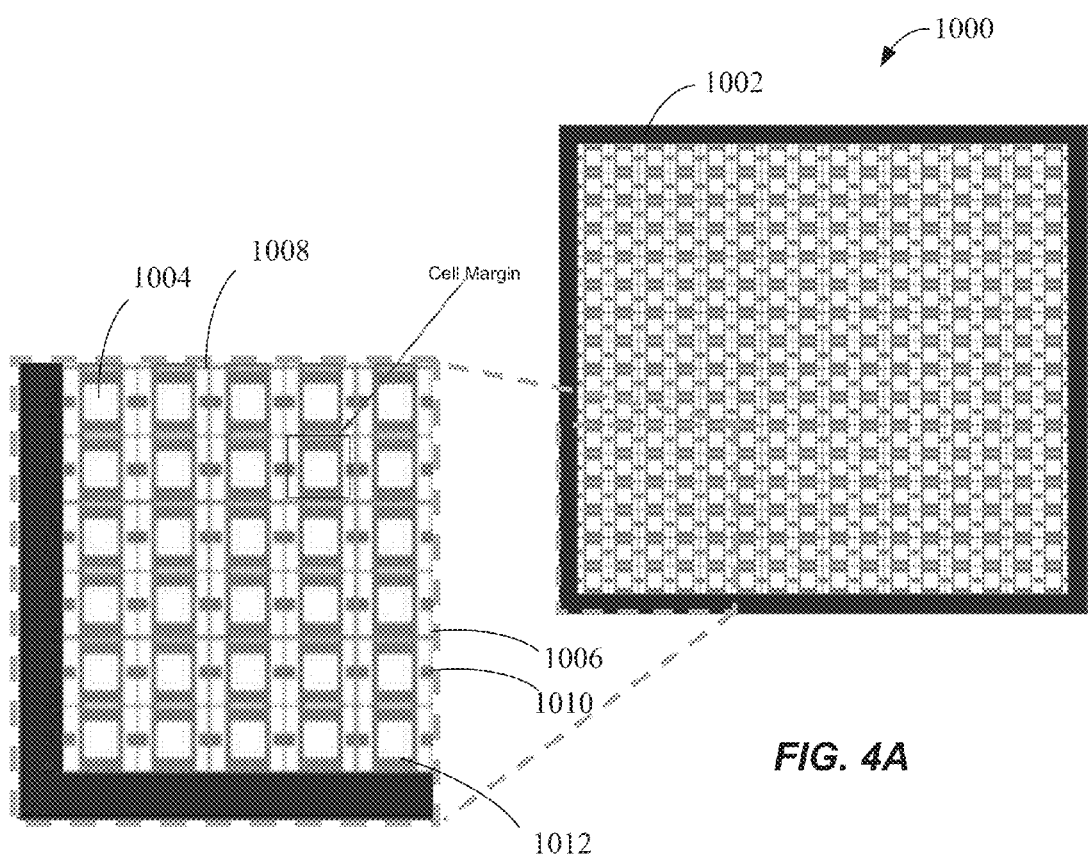
FIGS. 4A-4B are simplified plan views of a large panel frame/substrate that may be used in making MLP packages according to an embodiment of the present invention.

FIGS. 4A-4B are simplified plan views of a large panel leadframe 1000 that may be used in making MLP packages according to an embodiment of the present invention. As shown in FIG. 4A, large panel leadframe 1000 has a rectangular outer frame 1002. In an embodiment, outer frame 1002 has a size of 178 mm×178 mm. As would be appreciated by one of ordinary skill in the art, outer frame 1002 may be larger or smaller depending on the particular application. A plurality of inner frames are arranged in a matrix pattern within outer frame 1002. FIG. 4B is an enlarged view of a portion of large panel leadframe 1000 showing some of the inner frames. As shown in FIG. 4B, the plurality of inner frames are attached to horizontal and vertical connecting bars 1006, 1008. Each of the inner frames may include a die pad (e.g., chip attach surface) or a die attach region (e.g., a region or cavity without a die pad) 1004. In some embodiments that include die pads, the die pads 1004 are planar. In other embodiments that include die pads, the die pads 1004 include a planar surface extending along a bottom of a recessed cavity. An IC chip may be attached to the die pad in each of the inner frames or placed within the die attach region in each of the inner frames. Each of the inner frames also include leads 1010 arranged on opposing sides of the die pad or die attach region.

Figure 5:
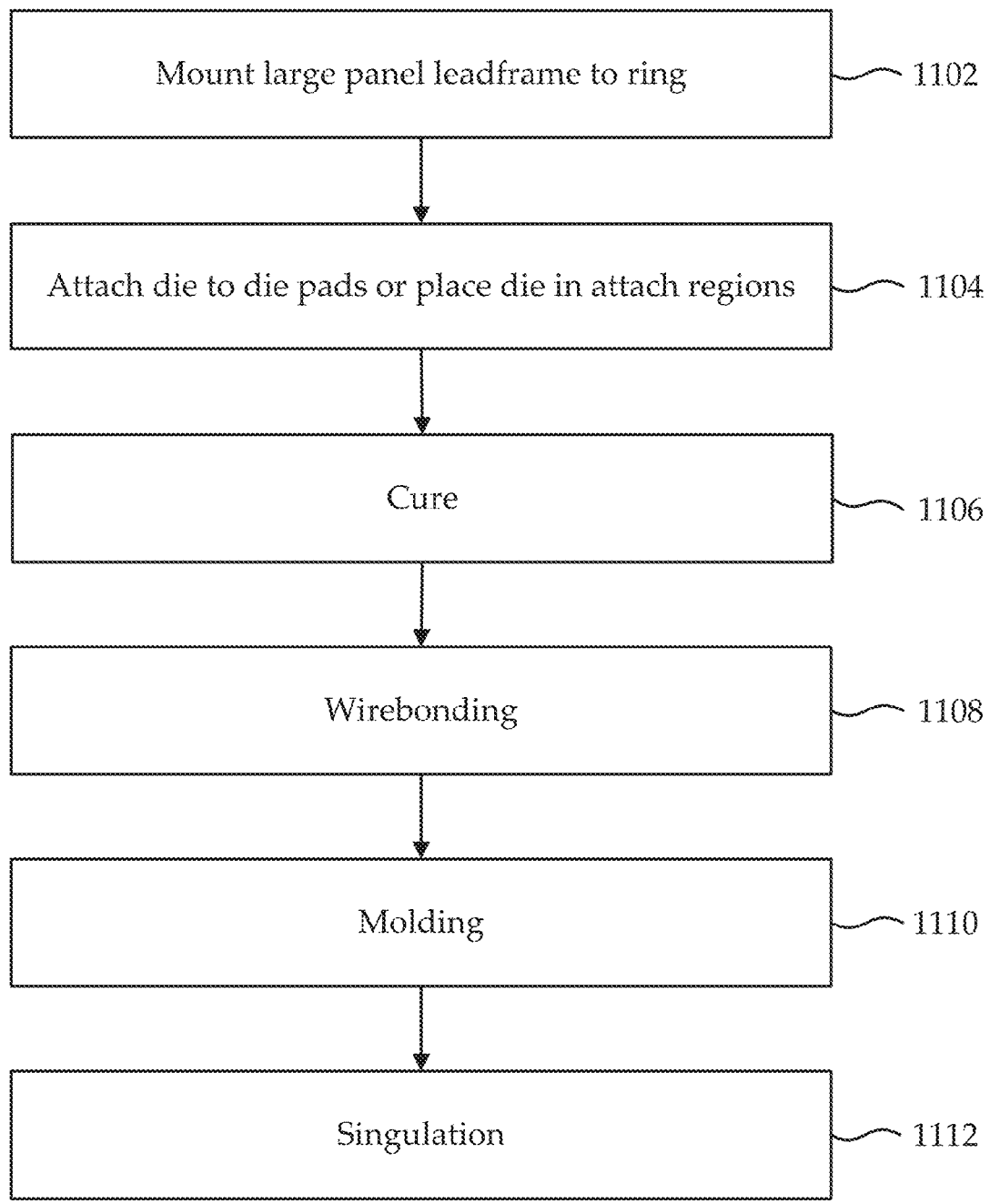
FIG. 5 is a flowchart illustrating an exemplary process of assembling an MLP package according to an embodiment of the present invention.

FIG. 5 is a flowchart illustrating an exemplary process of assembling an MLP package according to an embodiment of the present invention. Some embodiments of the invention provide increased packaging efficiency by using a large panel leadframe that is larger than conventional leadframes. As an example, a large panel leadframe having a size of up to 200 mm×200 mm or larger may be used in some embodiments. This is compared with conventional leadframes that may have a size of about 40 mm×140 mm. These features allow an extremely high density that is not possible with a conventional MLP packaging techniques. The increased packaging efficiency gained by using the large panel leadframe can reduce assembly costs. As described more fully below, the large panel leadframe may be mounted to a carrier or ring to support the large panel leadframe during the assembly process. Further, the large panel leadframe may be transported during assembly processes using a handler that provides precise movement in both "X" and "Y" directions (e.g., forward/ backward and lateral directions).

Figure 6:
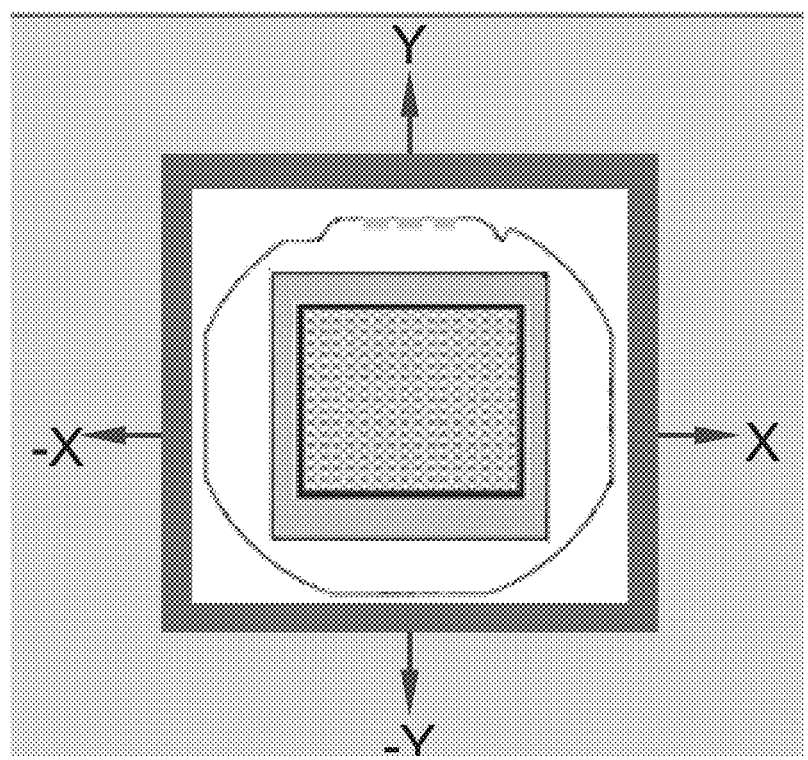
FIG. 6 is a simplified diagram of a large panel frame/ substrate mounted on a ring according to an embodiment of the present invention.

Steps 1102-1108 of FIG. 5 are typically considered part of a front of line (FOL) phase, and steps 1110-1112 are typically considered part of an end of line (EOL) phase. At step 1102, a large panel leadframe is mounted to a ring. The ring provides support for the large panel leadframe and enables precise movement during the assembly process. In an embodiment, the ring is a metal support made from aluminum or stainless steel. The large panel leadframe may be mounted to the ring using, for example, an adhesive tape. In an embodiment, the adhesive tape is a high temperature tape that can withstand temperatures that may exceed 200° C. during wirebonding and molding steps. As shown in FIG. 6, a large panel leadframe mounted to a circular-shaped ring can be transported in both "X" and "Y" directions during the assembly process.

In step 1104, IC chips or die are attached to die pads or placed in die attach regions of the large panel leadframe. The IC chips are attached to the die pads of large panel leadframes that include die pads. The IC chips are placed in the die attach regions of large panel leadframes that do not include die pads. Some MLP packages may include both die pads and die attach regions. In any of these configurations, the IC chips may be attached to a corresponding die pad or a corresponding die attach region using an adhesive or epoxy. Alternatively, the IC chips placed in die attach regions may be attached using the same adhesive tape that is used to mount the large panel leadframe to the ring. The IC chips are typically positioned onto the die pads or in the die attach regions using a pick and place method. Movement of the ring in both the "X" and "Y" directions enables precise placement of the IC chips.

In step 1106, the adhesive or epoxy used to attached the IC chips is cured (if the adhesive or epoxy are used). In an embodiment, the cure may include a thermal treatment at temperatures of between 100° C. to 200° C. for between 1 hour to 3 hours.

In step 1108, a wirebonding process is used to electrically connect leads on the large panel leadframe to respective bonding pads on the IC chips using bonding wires. Some embodiments may also include one or more cleaning steps that may include a plasma process in accordance with known techniques.

Figure 7A:
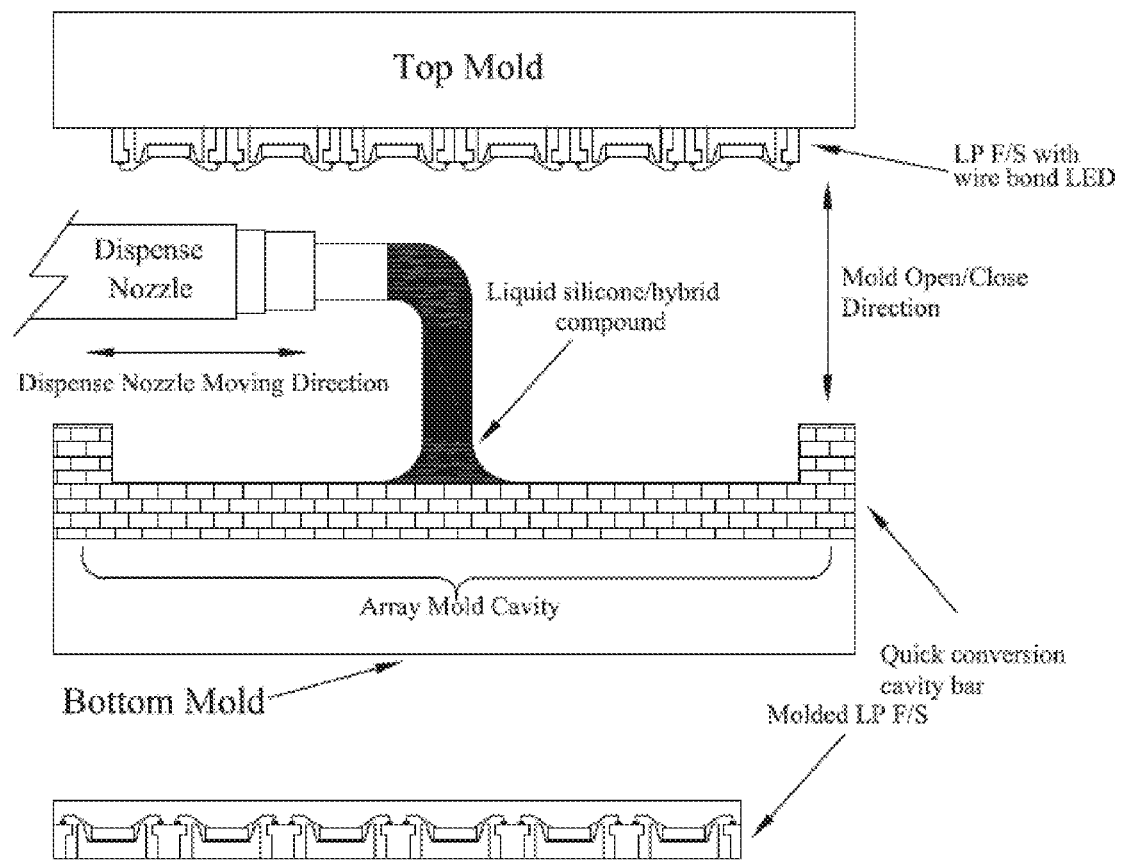
FIGS. 7A-7B are simplified cross-sectional views illustrating a molding process in assembly of a MLP package according to an embodiment of the present invention.
Figure 7B:
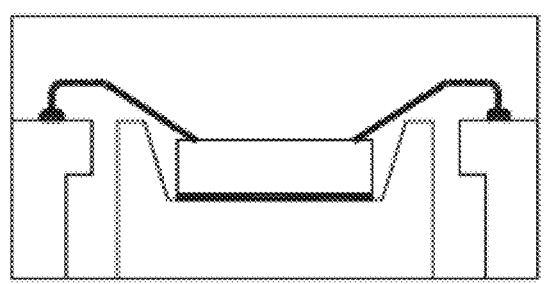
Figure 8A:
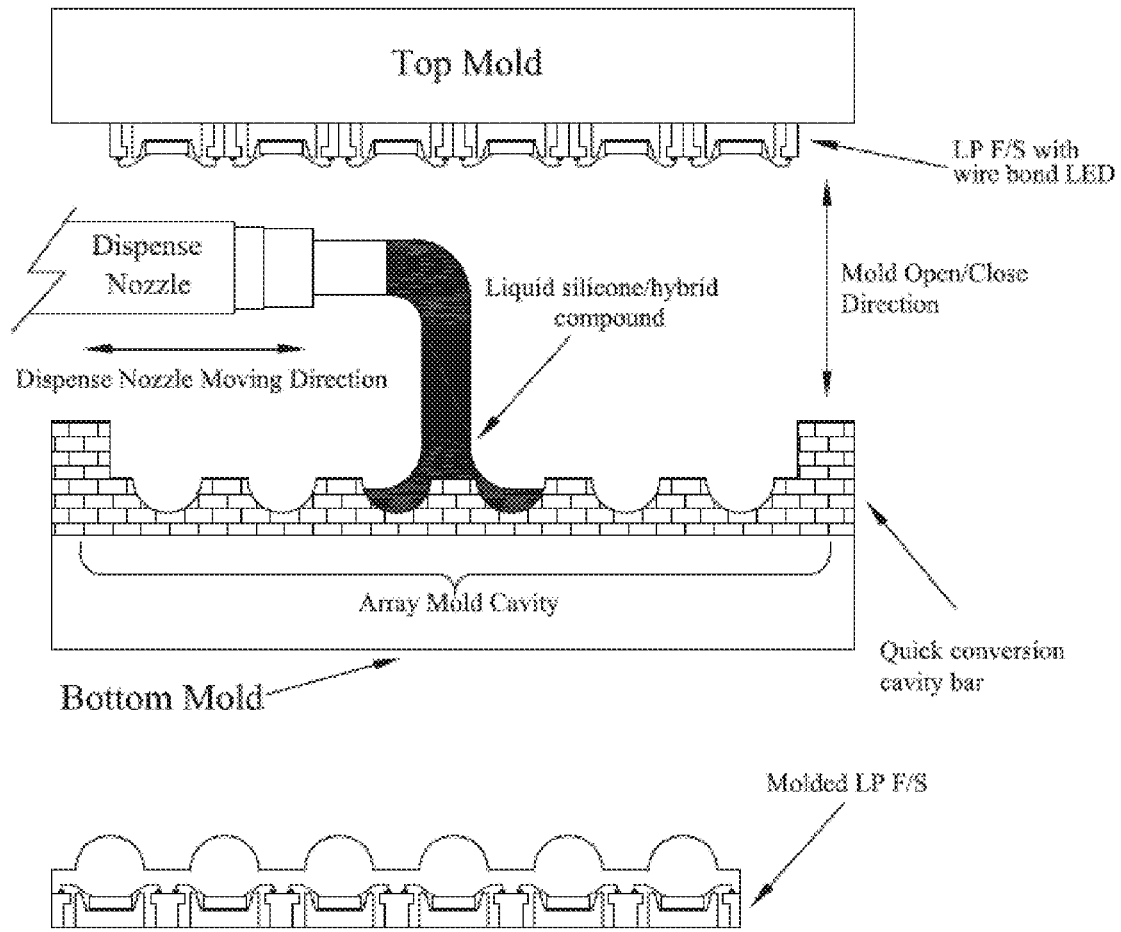
FIGS. 8A-8B are simplified cross-sectional views illustrating a molding process in assembly of a MLP package according to another embodiment of the present invention.
Figure 8B:
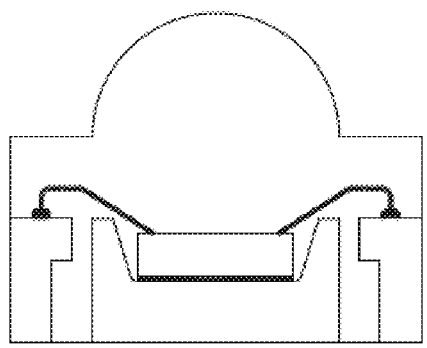

The EOL phase includes a molding process at step 1110. In an embodiment, the molding process includes dispensing an encapsulant material in an array mold cavity and submerging the large panel leadframe and attached IC chips in the encapsulant material. This can be shown with reference to FIGS. 7A-7B and 8A-8B, which illustrate exemplary molding processes for forming MLP packages. The exemplary molding process is illustrated with a large panel leadframe having die pads with a planar surface extending along a bottom of a recessed cavity. As illustrated in FIG. 7A, an encapsulant material, such as a silicone hybrid compound, may be injected in an array mold cavity using a dispense nozzle. The array mold cavity is then engaged with the large panel leadframe and the encapsulant material is cured to form an array of MLP packages. An exemplary MLP package formed using the array mold cavity of FIG. 7A is illustrated in FIG. 7B. FIGS. 8A-8B provide examples of MLP packages having a "dome" shape that may be formed by changing the array mold cavity illustrated in FIG. 8A. Array mold cavities having other designs may be used with in accordance with embodiments of the invention. The above molding processes are in contrast to conventional techniques that use individual as opposed to array mold cavities.

The array of MLP packages are separated at step 1112 using a singulation process to provide a plurality of MLP packages. The singulation process may include mechanical sawing, laser cutting, high pressure water jet cutting, or the like. The singulation process typically separates the MLP packages without cutting into the ring. For example, a mechanical sawing process may be used to cut through the large panel leadframe and separate the MLP packages, but the mechanical sawing process may cut through only a portion of the tape without cutting the ring. In this manner the ring may be re-used for subsequent packaging processes.

In some embodiments, the large panel leadframe remains mounted to the ring throughout the packaging process described above with regard to steps 1102 to 1112. In other embodiments, the ring may be removed from the large panel leadframe before the MLP packages are separated at step 1112. The ring is typically removed using a de-taping device. As an example, the ring and large panel leadframe may be positioned facing downward on a work station. A multi-axial tape gripper mechanism may be used to grasp a tape protrusion coupled to the ring and peel the tape from the ring. Once separated from the ring, the MLP packages may be offloaded for subsequent processing (e.g., testing).

It should be appreciated that the specific steps illustrated in FIG. 5 provide a particular method in accordance with an embodiment of the present invention. Other sequences of steps may be performed according to alternative embodiments. For example, the steps outlined above may be performed in a different order. Moreover, the individual steps illustrated in FIG. 5 may include multiple sub-steps that may be performed in various sequences as appropriate to the individual step. Furthermore, additional steps may be added or removed depending on the particular application. One of ordinary skill in the art would recognize many variations, modifications, and alternatives.

Note that the terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below.

Although specific embodiments of the present invention have been described in detail, it will be apparent to one skilled in the art that various changes and modification can be made without departing from the spirit and scope thereof. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description but should be determined with reference to the appended claims along with their full scope of equivalents.

What is claimed is:

1. A method of manufacturing integrated circuit packages, the method comprising:
   mounting a large panel leadframe having a substantially square shape to a ring, wherein the large panel leadframe includes a plurality of die pads and a corresponding plurality of leads arranged in a matrix pattern;
   attaching an integrated circuit chip to each of the die pads;
   applying an encapsulant material over the integrated circuit chips and at least a portion of the large panel leadframe; and
   separating the plurality of die pads and the corresponding leads from the large panel leadframe to form the integrated circuit packages, wherein the steps of attaching the integrated circuit chips and applying the encapsulant material are performed while the large panel leadframe is mounted to the ring.

2. The method of claim 1 wherein applying the encapsulant further comprises;
providing an array mold cavity;
dispensing the encapsulant material into the array mold cavity;
engaging the array mold cavity including the encapsulant material with the large panel leadframe including the integrated circuit chips; and
curing the encapsulant material.

3. The method of claim 1 wherein the large panel leadframe is mounted to the ring using an adhesive tape.

4. The method of claim 1 wherein the large panel leadframe and ring are transported using a handler that provides movement in forward/backward and lateral directions during the steps of attaching the integrated circuit chips, applying the encapsulant material, and separating the plurality of die pads and the corresponding leads from the large panel leadframe.

5. The method of claim 1 wherein each of the plurality of die pads are planar.

6. The method of claim 1 wherein each of the plurality of die pads include a planar surface extending along a bottom of a recessed cavity.

7. The method of claim 1 wherein the large panel leadframe has a size of about 200 mm by about 200 mm.

8. The method of claim 1 wherein the integrated circuit chips are attached to each of the plurality of die pads using an epoxy.

9. The method of claim 1 further comprising wirebonding the plurality of leads of the large panel leadframe to respective bonding pads disposed on a surface of the integrated circuit chips.

10. The method of claim 1 wherein the ring is substantially planar and the large panel leadframe is mounted to a surface of the ring.

11. The method of claim 1 wherein the integrated circuit chips include at least one of a light emitting diode (LED), a memory device, a logic device, or a processor.

12. The method of claim 1 wherein the integrated circuit packages include at least one of a quad-flat no-leads (QFN) package, a ball grid array (BGA) package, a small scale ball grid array (SSBGA) package, a land grid array (LGA) package, a system-in-package (SiP) package, or a mini-pak package.

13. A method of manufacturing integrated circuit packages, the method comprising:
mounting a large panel leadframe to a ring, wherein the large panel leadframe includes a plurality of die pads and a corresponding plurality of leads surrounding the die pads, the plurality of die pads and the plurality of leads arranged in a matrix pattern;
attaching an integrated circuit chip to each of the plurality of die pads;
wirebonding each of the plurality of leads to respective bonding pads disposed on a surface of the integrated circuit chips;
applying an encapsulant material overlaying the integrated circuit chips and at least a part of the large panel leadframe; and
separating the plurality of die pads and the corresponding leads from the large panel leadframe to form the integrated circuit packages, wherein the steps of attaching the integrated circuit chips, wirebonding each of the plurality of leads, applying the encapsulant material, and separating the plurality of die pads are performed while the large panel leadframe is mounted to the ring.

14. The method of claim 13 wherein each of the plurality of die pads are planar.

15. The method of claim 13 wherein each of the plurality of die pads include a planar surface extending along a bottom of a recessed cavity.

16. The method of claim 13 wherein the integrated circuit chips include at least one of a light emitting diode (LED), a memory device, a logic device, or a processor.

17. The method of claim 13 wherein the ring is substantially planar and the large panel leadframe is mounted to a surface of the ring.

18. A method of manufacturing integrated circuit packages, the method comprising:
mounting a large panel leadframe to a ring, wherein the large panel leadframe includes a plurality of die attach regions and a corresponding plurality of leads surrounding the die attach regions, the plurality of die attach regions and the plurality of leads arranged in a matrix pattern;
placing one or more integrated circuit chips in each of the plurality of die attach regions;
wirebonding each of the plurality of leads to respective bonding pads disposed on a surface of the integrated circuit chips;
applying an encapsulant material overlaying the integrated circuit chips and at least a part of the large panel leadframe; and
separating the plurality of die attach regions and the corresponding leads from the large panel leadframe to form the integrated circuit packages, wherein the steps of placing one or more circuit chips in each of the die attach regions, wirebonding each of the plurality of leads to respective bonding pads, applying the encapsulant material, and separating the plurality of die attach regions and corresponding leads from the large panel leadframe may be performed while the large panel leadframe is mounted to the ring.

19. The method of claim 18 wherein the die attach regions include die pads.

20. The method of claim 18 wherein the die attach regions do not include die pads.

* * * * *